(12) United States Patent
Chan

(10) Patent No.: US 10,425,078 B2
(45) Date of Patent: Sep. 24, 2019

(54) HIGH-SIDE POWER SWITCH CONTROL CIRCUIT

(71) Applicant: Mosway Technologies Limited, Hong Kong (CN)

(72) Inventor: On Bon Peter Chan, Hong Kong (CN)

(73) Assignee: Mosway Technologies Limited, Hong Kong (CN)

( * ) Notice: Subject to any disclaimer, the term of this patent is extended or adjusted under 35 U.S.C. 154(b) by 0 days.

(21) Appl. No.: 15/697,563

(22) Filed: Sep. 7, 2017

(65) Prior Publication Data

US 2018/0076811 A1    Mar. 15, 2018

Related U.S. Application Data

(60) Provisional application No. 62/385,280, filed on Sep. 9, 2016.

(51) Int. Cl.
| | | |
|---|---|---|
| *H03L 5/00* | (2006.01) | |
| *H03K 17/687* | (2006.01) | |
| *H03K 19/0185* | (2006.01) | |

(52) U.S. Cl.
CPC . *H03K 17/6871* (2013.01); *H03K 19/018507* (2013.01)

(58) Field of Classification Search
CPC ..... H03K 19/018521; H03K 3/356113; H03K 19/00315; H03K 17/102; H03K 3/012; H03K 19/00361; H03K 19/00384; H04L 25/028; H04L 25/0272

USPC .................................................. 327/108, 333
See application file for complete search history.

(56) References Cited

U.S. PATENT DOCUMENTS

| | | | |
|---|---|---|---|
| 5,514,981 A | 5/1996 | Tam et al. | |
| 8,351,235 B2* | 1/2013 | Akahane | H03K 19/018521 365/80 |
| 9,966,944 B2* | 5/2018 | Rossi | H03K 17/04123 |
| 2009/0256619 A1* | 10/2009 | Hsu | H03K 17/6877 327/379 |
| 2011/0074485 A1* | 3/2011 | Yamamoto | H03K 17/168 327/333 |
| 2013/0278319 A1* | 10/2013 | Akahane | H03K 3/356182 327/333 |

* cited by examiner

*Primary Examiner* — Anh Q Tra
(74) *Attorney, Agent, or Firm* — Leydig, Voit & Mayer

(57) ABSTRACT

A circuit for controlling a high-side power switch includes a level shifting circuit configured to receive an input signal for selectively configuring a logic command circuit to be in a set state, for providing a first output signal to the high-side power switch, and in a reset state, for providing a second output signal, different from the first output signal, to the high-side power switch. The circuit also includes a regulation circuit configured to detect an indicative signal indicative of the output signal provided to the high-side power switch and to change sensitivity of the level shifting circuit to the input signal, based on the indicative signal that is detected.

29 Claims, 9 Drawing Sheets

HIGH-SIDE POWER SWITCH CONTROL CIRCUIT

TECHNICAL FIELD

The invention relates to a high-side power switch control circuit. More particularly, although not exclusively, the invention relates to a state dependent set-dominant level shifting circuit, a state dependent reset-dominant level shifting circuit, a state dependent set- and reset-dominant level shifting circuit for use in the high-side circuit of a bridge driver or a half-bridge driver.

BACKGROUND

FIG. 1 shows a conventional half-bridge driver circuit 100. The circuit 100 is arranged to receive a high-side input HIN and a low-side input LIN, for controlling a high-side output HO and a low-side output LO. The low-side output LO can change between voltage levels COM and VCC. For example, the potential of COM may be at ground (zero V) and the potential of VCC may be 20V. The high-side output HO can change between the floating voltage levels VS and VB. |VB−VS| is the magnitude of the power supply voltage for the high side circuit while |VCC−COM| is the magnitude of the power supply voltage for the low side circuit. VS is a floating voltage with reference to COM, which can be at a low voltage below COM and at a very high voltage above COM (e.g. 600V). VB can be referred to as the high-side voltage supply terminal. For example, the potential of VS may be 1000V and the potential of VB may be 1200V. The high-side output HO and the low-side output LO are each arranged to drive a respective power switch (not shown) which is further connected to a load. As shown in FIG. 1, the circuit 100 includes an input logic module arranged to receive the high-side input HIN and the low-side input LIN. The input logic module is connected with a low-side circuit providing the low-side output LO and a high-side circuit providing the high-side output HO.

The low-side circuit includes a first path with an under-voltage lockout (UVLO) module connected with VCC and a second path with a delay module and a buffer module. A low-side driver module formed by two switches is connected across VCC and COM. More particularly, the buffer module is connected with the gate terminals of both switches. The drain terminals of the switches are connected with the low-side output LO.

The high-side circuit includes a pulse generator connected with the input logic module and arranged to receive a signal processed by the input logic module. The pulse generator is connected with a level shifting circuit with two switches 101, 102 (high voltage LDMOS devices) at their gate terminals. Source terminals of the two switches 101, 102 are connected together and to COM. The drain terminal of one switch 101 is connected with a $\overline{\text{RESET}}$ node that is connected with a pulse filter 107 that is turn connected to a $\overline{\text{RESET}}$ terminal of a RS latch 108. The drain terminal of the other switch 102 is connected with a $\overline{\text{SET}}$ node that is connected with the pulse filter 107 that is turn connected to a $\overline{\text{SET}}$ terminal of the RS latch 108. The level shifting circuit also includes a resistor 103 arranged between the $\overline{\text{RESET}}$ node and VB and a resistor 104 arranged between the $\overline{\text{SET}}$ node and VB. A buffer module 109 and a high-side driver module with two switches 110, 111 are connected between the output of the RS latch 108 and the high-side output HO. The drain terminals of the switches 110, 111 are connected with the high-side output HO.

U.S. Pat. No. 5,514,981 discloses a driver circuit with a similar arrangement to that of FIG. 1.

FIG. 2 shows the waveforms at the high-side input HIN, the $\overline{\text{SET}}$ node, the $\overline{\text{RESET}}$ node, and the high-side output HO. As shown in the Figure, during state change of the high-side output HO as the result of the state change of the high-side input HIN, common mode noise exists at both the $\overline{\text{SET}}$ and $\overline{\text{RESET}}$ nodes due to capacitance at these nodes. In circuit configurations where the two resistors 103, 104 are of the same resistance and the two switching devices 101, 102 (high voltage LDMOS devices) are of the same size, the common mode noise produced at the $\overline{\text{SET}}$ and $\overline{\text{RESET}}$ nodes have substantially the same magnitude. Such common mode noise, if allowed to pass through the pulse filter 107, may potentially steer the RS latch 108 to the wrong state. In some applications, such latch on/latch off fault can burn or damage the power switches in the external half bridge device (not shown) driven by the driver circuit. In some other applications, even the integrated circuit 100 can be burnt or damaged.

SUMMARY OF THE INVENTION

In accordance with a first aspect of the invention, there is provided a circuit for controlling a high-side power switch, comprising: a level shifting circuit configured to receive an input signal for selectively configuring a logic command circuit to be in a set state for providing a first output signal to the high-side power switch and in a reset state for providing a second output signal different from the first output signal to the high-side power switch; and a regulation circuit configured to detect a signal indicative of the output signal provided to the high-side power switch and to change a sensitivity of the level shifting circuit to the input signal based on the detected signal. By changing the sensitivity of the level shifting circuit to the input signal based on the detected signal, the change of state of the level shifting circuit can be flexibly and reliably controlled. In one embodiment, the input signal comprises a signal pulse received from a pulse generator. The input signal may contain noise.

In one embodiment of the first aspect, the regulation circuit is configured to arrange the level shifting circuit to be in a set-dominant configuration in which a sensitivity of the level shifting circuit to an input signal for configuring the logic command circuit to a reset state is reduced in a period during which the detected signal indicates a transition from the second output signal to the first output signal. By reducing the sensitivity in this manner, the level shifting circuit is less susceptible to unwanted change to the reset state caused by noise. Preferably, the sensitivity is reduced only during the period.

In one embodiment of the first aspect, the regulation circuit is configured to arrange the level shifting circuit to be in a set-dominant configuration in which a sensitivity of the level shifting circuit to an input signal for configuring the logic command circuit to a reset state is reduced when the detected signal indicates that the first output signal is provided to the high-side power switch. By reducing the sensitivity in this manner, the level shifting circuit is less susceptible to unwanted change to the reset state caused by noise.

In one embodiment of the first aspect, the regulation circuit is configured to arrange the level shifting circuit to be in a reset-dominant configuration in which a sensitivity of the level shifting circuit to an input signal for configuring the logic command circuit to a set state is reduced in a period during which the detected signal indicates a transition from the first output signal to the second output signal. By reducing the sensitivity in this manner, the level shifting circuit is less susceptible to unwanted change to the set state caused by noise. Preferably, the sensitivity is reduced only during the period.

In one embodiment of the first aspect, the regulation circuit is configured to arrange the level shifting circuit to be in a reset-dominant configuration in which a sensitivity of the level shifting circuit to an input signal for configuring the logic command circuit to a set state is reduced when the detected signal indicates that the second output signal is provided to the high-side power switch. By reducing the sensitivity in this manner, the level shifting circuit is less susceptible to unwanted change to the set state caused by noise.

In one embodiment of the first aspect, the regulation circuit is configured to arrange the level shifting circuit to be in: a set-dominant configuration in which a sensitivity of the level shifting circuit to an input signal for configuring the logic command circuit to a reset state is reduced in a period during which the detected signal indicates a transition from the second output signal to the first output signal; and a reset-dominant configuration in which a sensitivity of the level shifting circuit to an input signal for configuring the logic command circuit to a set state is reduced in a period during which the detected signal indicates a transition from the first output signal to the second output signal. By reducing the sensitivities in this manner, the level shifting circuit is less susceptible to unwanted state change during both periods. Preferably, the respective sensitivities are reduced only during the respective periods.

In one embodiment of the first aspect, the regulation circuit is configured to arrange the level shifting circuit to be in: a set-dominant configuration in which a sensitivity of the level shifting circuit to an input signal for configuring the logic command circuit to a reset state is reduced when the detected signal indicates that the first output signal is provided to the high-side power switch; and a reset-dominant configuration in which a sensitivity of the level shifting circuit to an input signal for configuring the logic command circuit to a set state is reduced when the detected signal indicates that the second output signal is provided to the high-side power switch. By reducing the sensitivities in this manner, the level shifting circuit is less susceptible to unwanted state change at all times.

In one embodiment of the first aspect, the level shifting circuit comprises: a first switch connected with the logic command circuit and arranged to receive an input signal; and a second switch connected with the logic command circuit and arranged to receive an input signal; and wherein the regulation circuit is arranged to change at least one of: a first equivalent resistance between the first switch and a high-side voltage supply, and a second equivalent resistance between the second switch and the high side power supply terminal, for changing the sensitivity of the level shifting circuit to the input signal. Preferably, the regulation circuit is arranged to change both the first equivalent resistance and the second equivalent resistance.

In one embodiment of the first aspect, the regulation circuit is arranged to control one or both of the first and second equivalent resistances such that the first equivalent resistance is lower than the second equivalent resistance in a period during which the detected signal indicates a transition from the first output signal to the second output signal and to control one or both of the first and second equivalent resistances such that the first equivalent resistance is higher than the second equivalent resistance otherwise. Preferably, the regulation circuit is arranged to control one or both of the first and second equivalent resistances such that the first equivalent resistance is lower than the second equivalent resistance only in a period during which the detected signal indicates a transition from the first output signal to the second output signal and to control one or both of the first and second equivalent resistances such that the first equivalent resistance is higher than the second equivalent resistance otherwise.

In one embodiment of the first aspect, the regulation circuit is arranged to control one or both of the first and second equivalent resistances such that the first equivalent resistance is lower than the second equivalent resistance when the detected signal indicates that the second output signal is provided to the high-side power switch and to control one or both of the first and second equivalent resistances such that the first equivalent resistance is higher than the second equivalent resistance otherwise.

In one embodiment of the first aspect, the regulation circuit is arranged to control one or both of the first and second equivalent resistances such that the first equivalent resistance is higher than the second equivalent resistance in a period during which the detected signal indicates a transition from the second output signal to the first output signal and to control one or both of the first and second equivalent resistances such that the first equivalent resistance is lower than the second equivalent resistance otherwise. Preferably, the regulation circuit is arranged to control one or both of the first and second equivalent resistances such that the first equivalent resistance is higher than the second equivalent resistance only in a period during which the detected signal indicates a transition from the second output signal to the first output signal and to control one or both of the first and second equivalent resistances such that the first equivalent resistance is lower than the second equivalent resistance otherwise.

In one embodiment of the first aspect, the regulation circuit is arranged to control one or both of the first and second equivalent resistances such that the first equivalent resistance is higher than the second equivalent resistance when the detected signal indicates that the first output signal is provided to the high-side power switch and to control one or both of the first and second equivalent resistances such that the first equivalent resistance is lower than the second equivalent resistance otherwise.

In one embodiment of the first aspect, the first switch and the second switch are semiconductor switches. Preferably, the first switch and the second switch are LDMOS devices adapted for high voltage applications.

In one embodiment of the first aspect, the first switch and the second switch are identical, in structure, in function, or in both. In one embodiment, the first switch and the second switch are of the same size.

Preferably, the level shifting circuit further comprises: a first resistor connected between the first switch and a high-side voltage supply; and a second resistor connected between the second switch and the high-side voltage supply; wherein the regulation circuit comprises at least one of: a third switch connected across the first resistor, and is selectively controlled to turn-on and turn-off based on the detected signal to change the equivalent resistance between the first switch and the high-side voltage supply, and a fourth switch connected across the second resistor, and is selectively controlled to turn-off and turn-on based on the detected signal to change the equivalent resistance between the second switch and the high-side voltage supply. In one embodiment, the regulation circuit comprises both the third and the fourth switches. The high-side voltage supply may be a floating voltage supply.

In one embodiment of the first aspect, the regulation circuit comprises a control logic circuit to: turn-on the third switch when the detected signal indicates that the second output signal is provided to the high-side power switch, and turn-off the third switch when the detected signal indicates that the first output signal is provided to the high-side power switch.

In one embodiment of the first aspect, the regulation circuit comprises a control logic circuit to: turn-on the fourth switch when the detected signal indicates that the first output signal is provided to the high-side power switch, and turn-off the fourth switch when the detected signal indicates that the second output signal is provided to the high-side power switch.

In one embodiment of the first aspect, the regulation circuit comprises a control logic circuit to: turn-on the third switch in a period during which the detected signal indicates a transition from the first output signal to the second output signal, and turn-off the third switch otherwise.

In one embodiment of the first aspect, the regulation circuit comprises a control logic circuit to: turn-on the fourth switch in a period during which the detected signal indicates a transition from the second output signal to the first output signal, and turn-off the fourth switch otherwise.

Preferably, the control logic circuit comprises a mono-stable circuit.

In one embodiment of the first aspect, the first resistor and the second resistor have the same resistance.

In one embodiment of the first aspect, the first resistor and the second resistor are resistors with fixed resistance(s). In another embodiment, one or both of them may be a variable resistor.

Preferably, the third switch and the fourth switch are semiconductor switches. In one embodiment, the third switch and the fourth switch may each comprise a MOSFET.

Preferably, the third switch and the fourth switch are identical, in structure, in function, or in both. Preferably, the third switch and the fourth switch have the same size.

Preferably, the logic command circuit comprises a bi-stable circuit operable in the set state and the reset state. The bi-stable circuit may comprise a latching circuit or a flip flop.

In one embodiment of the first aspect, the first output signal is arranged to turn-on the high-side power switch and the second output signal is arranged to turn-off the high-side power switch.

In one embodiment of the first aspect, the signal indicative of the output signal provided to the high-side power switch comprises a signal detected downstream of the logic command circuit. Such signal may be, for example, a signal directly outputted by the logic command circuit or a signal into the high-side power switch.

In accordance with a second aspect of the invention, there is provided a half bridge driver circuit comprising the circuit in accordance with the first aspect.

In accordance with a third aspect of the invention, there is provided an integrated circuit comprising the circuit in accordance with the first aspect.

It is an object of the invention to address the above needs, to overcome or substantially ameliorate the above disadvantages or, more generally, to provide an improved high-side power switch control circuit for use in a bridge driver or a half-bridge driver.

BRIEF DESCRIPTION OF THE DRAWINGS

Embodiments of the invention will now be described, by way of example, with reference to the accompanying drawings in which.

DETAILED DESCRIPTION OF THE PREFERRED EMBODIMENT

Figure 1:
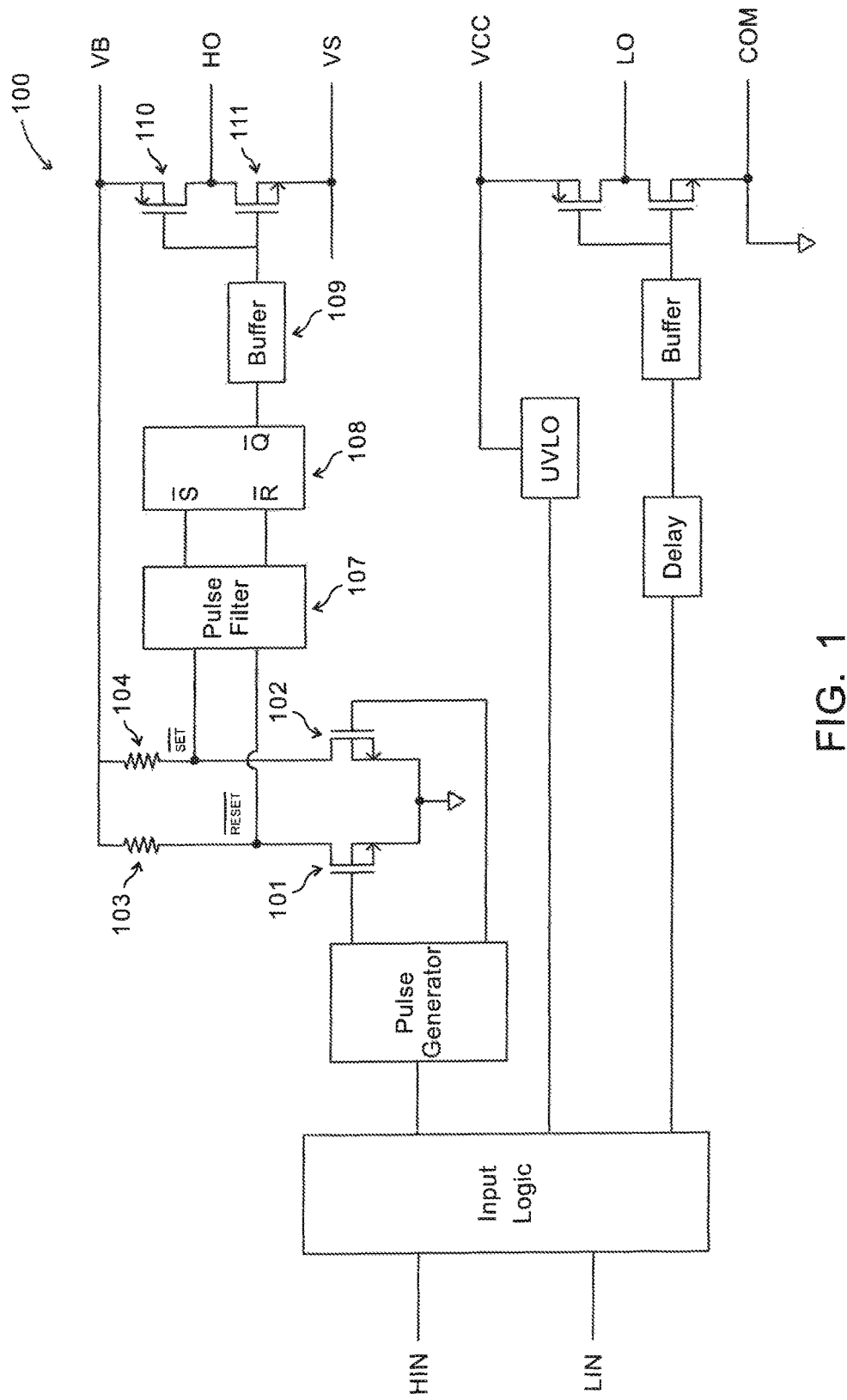
FIG. 1 is a block diagram of a conventional half-bridge driver circuit.
Figure 2:
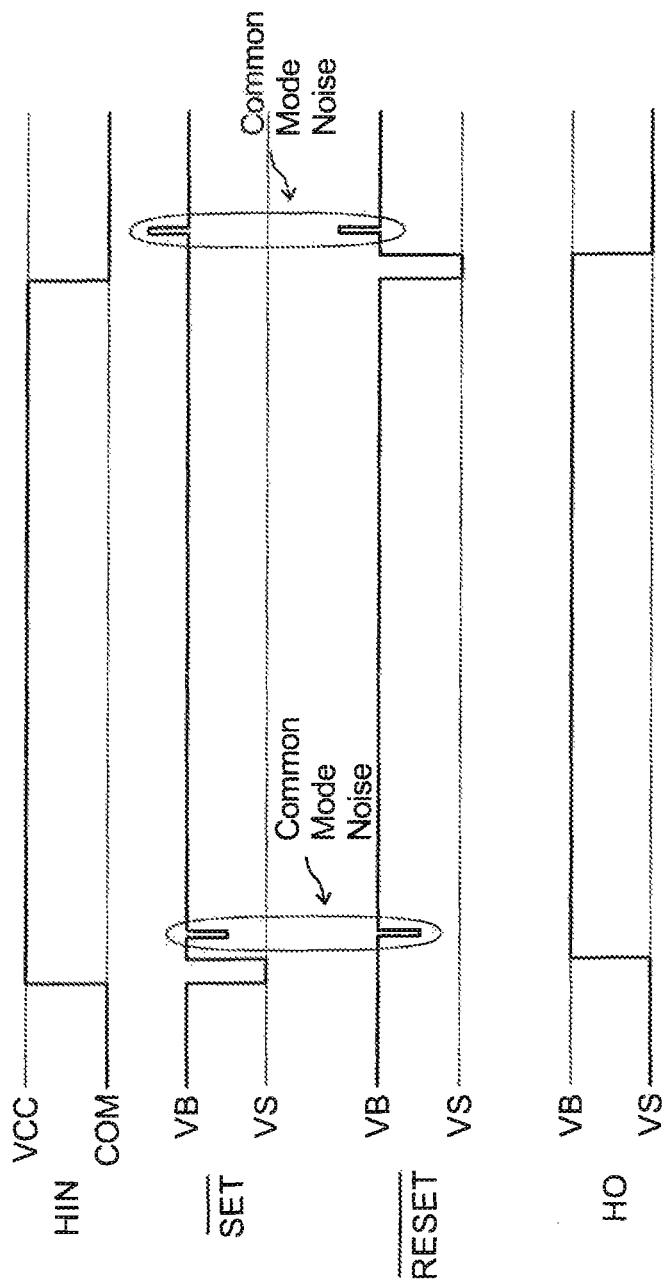
FIG. 2 is a plot showing the switching waveforms for the high-side circuit of the conventional half-bridge driver circuit of FIG. 1.
Figure 3:
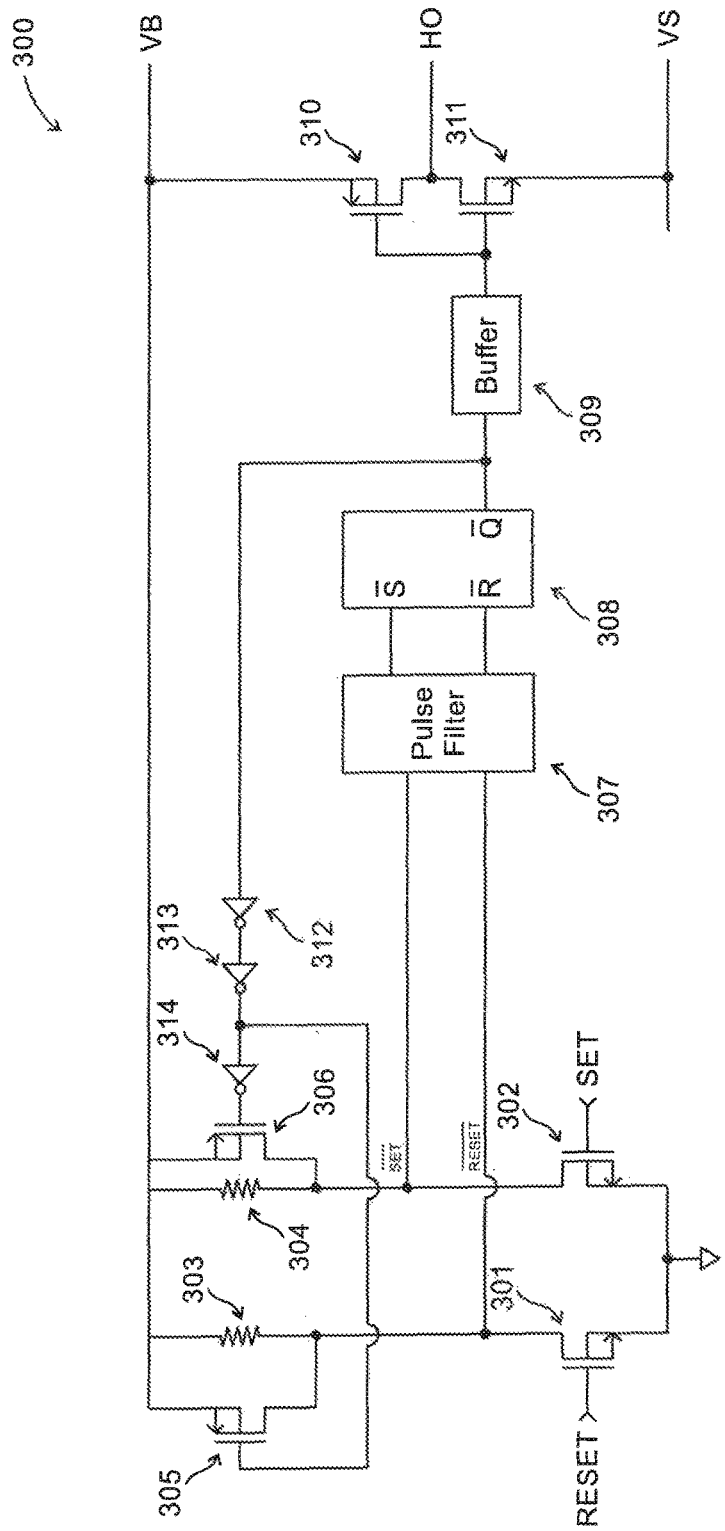
FIG. 3 is a high-side control circuit operable in both set-dominant and reset-dominant configurations in accordance with an embodiment of the invention.

FIG. 3 shows a high-side control circuit 300 in one embodiment of the invention. The circuit 300 can be arranged to replace the conventional high-side control circuit (the high-side circuit portion downstream of the pulse generator) in the circuit 100 of FIG. 1. As shown in FIG. 3, the circuit 300 includes a level shifting circuit having two high voltage LDMOS devices 301, 302 each arranged to receive, at the gate terminal, a control signal from a pulse generator (not shown). In this embodiment, the pair of high voltage LDMOS devices 301 and 302 have the same device size. The high voltage LDMOS device 301 is connected with a resistor 303; the high voltage LDMOS device 302 is connected with a resistor 304. The other connecting terminals of both resistors 303, 304 are connected to VB. A $\overline{\text{RESET}}$ node is arranged between the device 301 and the resistor 303; a $\overline{\text{SET}}$ node is arranged between the device 302 and the resistor 304. The level shifting circuit is arranged to selectively configure a logic command circuit, in the form of a RS latch 308, to be in either a SET state or in a RESET state. A pulse filter 307 is arranged between the $\overline{\text{SET}}$ and $\overline{\text{RESET}}$ nodes and the RS latch 308. The RS latch 308 is arranged to provide an output signal to the buffer 309 and the switches 310, 311 in the high-side driver circuit, and hence to the high-side output HO to drive a power switch (not shown) connected at the high-side output HO. Depending on the state of the RS latch 308, the high-side output HO may provide a high signal or a low signal to the power switch. In the present embodiment, the circuit 300 also includes a regulation circuit with two MOSFETs 305, 306, each connected across a respective resistor 303, 304. In this embodiment, the two resistors 303, 304 have the same resistance.

The regulation circuit is connected with the output $\overline{Q}$ of the RS latch 308 and with the MOSFETs 305, 306. Two inverters 312, 313 are arranged in a signal path to the gate terminal of the MOSFET 305. Three inverters 312, 313, 314, including the two in the signal path to the gate terminal of the MOSFET 305, are arranged in another signal path to the gate terminal of the MOSFET 306. The regulation circuit is arranged to change a sensitivity of the level shifting circuit to the input signal based on the detected signal at output $\overline{Q}$.

In operation, if the high-side output HO changes from low to high (e.g., from VS to VB), the output signal from the RS latch 308 changes from high to low. This signal, as detected by the regulation circuit, propagates through inverters 312, 313 and 314 to turn on MOSFET 305 and turn off MOSFET 306. As a result, the equivalent resistance between VB and the drain node of high voltage LDMOS device 302 equals to the resistance of the resistor 304; while the equivalent resistance between VB and the drain node of high voltage LDMOS device 301 equals to the parallel of the resistance of resistor 303 and the on resistance of MOSFET 305, which is lower compared to the resistance of the resistor 304. The unbalance of these two equivalent resistances causes common mode noise at the drain node of high voltage LDMOS device 302 to be larger in magnitude than common mode noise at the drain node of high voltage LDMOS device 301. Hence, the level shifting circuit becomes set-dominant during the time the high-side output HO changes from low to high, as well as in high state. In other words, the level shifting circuit becomes less sensitive to input signals for configuring the RS latch 308 to a reset state due to common mode noise, and hence is less susceptible to unwanted change to the reset state due to common mode noise.

Alternatively, if the high-side output HO changes from high to low (e.g., from VB to VS), the output signal from the RS latch 308 changes from low to high. This signal, as detected by the regulation circuit, propagates through the inverters 312, 313 and 314 to turn off MOSFET 305 and turn on MOSFET 306. Hence, the equivalent resistance between VB and the drain node of high voltage LDMOS device 301 equals to the resistance of the resistor 303; while the equivalent resistance between VB and the drain node of high voltage LDMOS device 302 is the parallel of the resistance of the resistor 304 and the on resistance of MOSFET 306 (a lower resistance compared with that of resistor 303). The unbalance of these two equivalent resistances causes common mode noise at the drain node of high voltage LDMOS device 301 to be larger in magnitude than common mode noise at the drain node of high voltage LDMOS device 302. Hence, the level shifting circuit becomes reset-dominant during the time the high-side output HO changes from high to low, as well as in low state. In other words, the level shifting circuit becomes less sensitive to input signals for configuring the RS latch 308 to a set state due to common mode noise, and hence is less susceptible to unwanted change to the set state due to common mode noise.

It should be noted that various modification can be made to the circuit 300 in FIG. 3 to provide other embodiments of the invention. For example the high voltage LDMOS devices 301, 302 may be replaced with other semiconductor switches. The switches 301, 302 may be of different device sizes. The resistors 303, 304 may have different resistances, or they may be variable resistors. The MOSFETs 305, 306 may be other semiconductor switches. While MOSFETs 305 and 306 are preferred to have the same size this is not essential. The control signal used by the regulation circuit to modulate the two resistance values in the level shifting circuit can be taken from other positions, for example, from any equivalent circuit nodes in the buffer 309, downstream of the buffer 309, or directly from the high-side output HO (optionally using an additional inverter).

Figure 4:
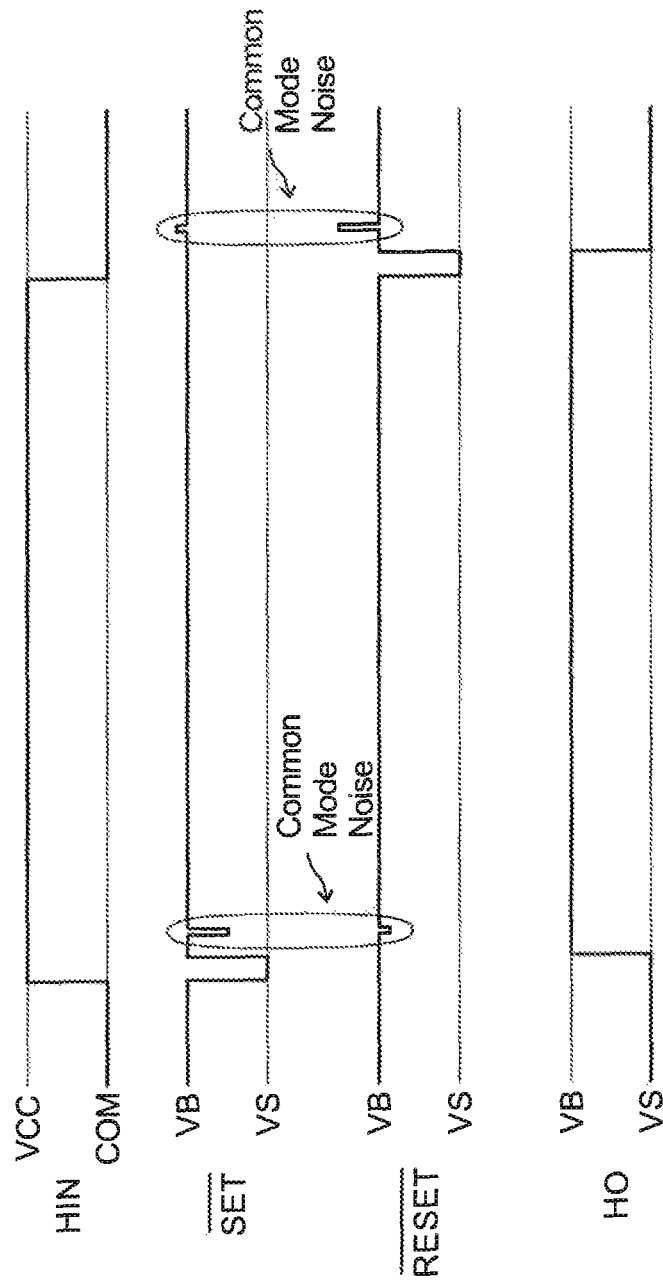
FIG. 4 is a plot showing the switching waveforms for the high-side control circuit of FIG. 3.

The set-dominant and reset-dominant effects can be observed in FIG. 4. As shown in FIG. 4, common mode noise at the $\overline{SET}$ node and the $\overline{RESET}$ node has different magnitudes for different high-side output HO state change. Also, in operation, the electric potential of the $\overline{SET}$ node and the $\overline{RESET}$ node are substantially equal to VB for nearly all the time, except when there is a command state change, after which some common mode noise may be present at both the $\overline{SET}$ node and the $\overline{RESET}$ node for a short period of time (e.g., in the form of pulse).

Further improvements can be made to the circuit 300 of FIG. 3 to address a potential problem of increasing the device size of high voltage LDMOS devices as caused by the unbalance of equivalent drain load equivalent resistance during the whole period of high side output state. In some applications, it may be more desirable that the set-dominant and reset-dominant functions only occur during the high-side state transition period.

Figure 5:
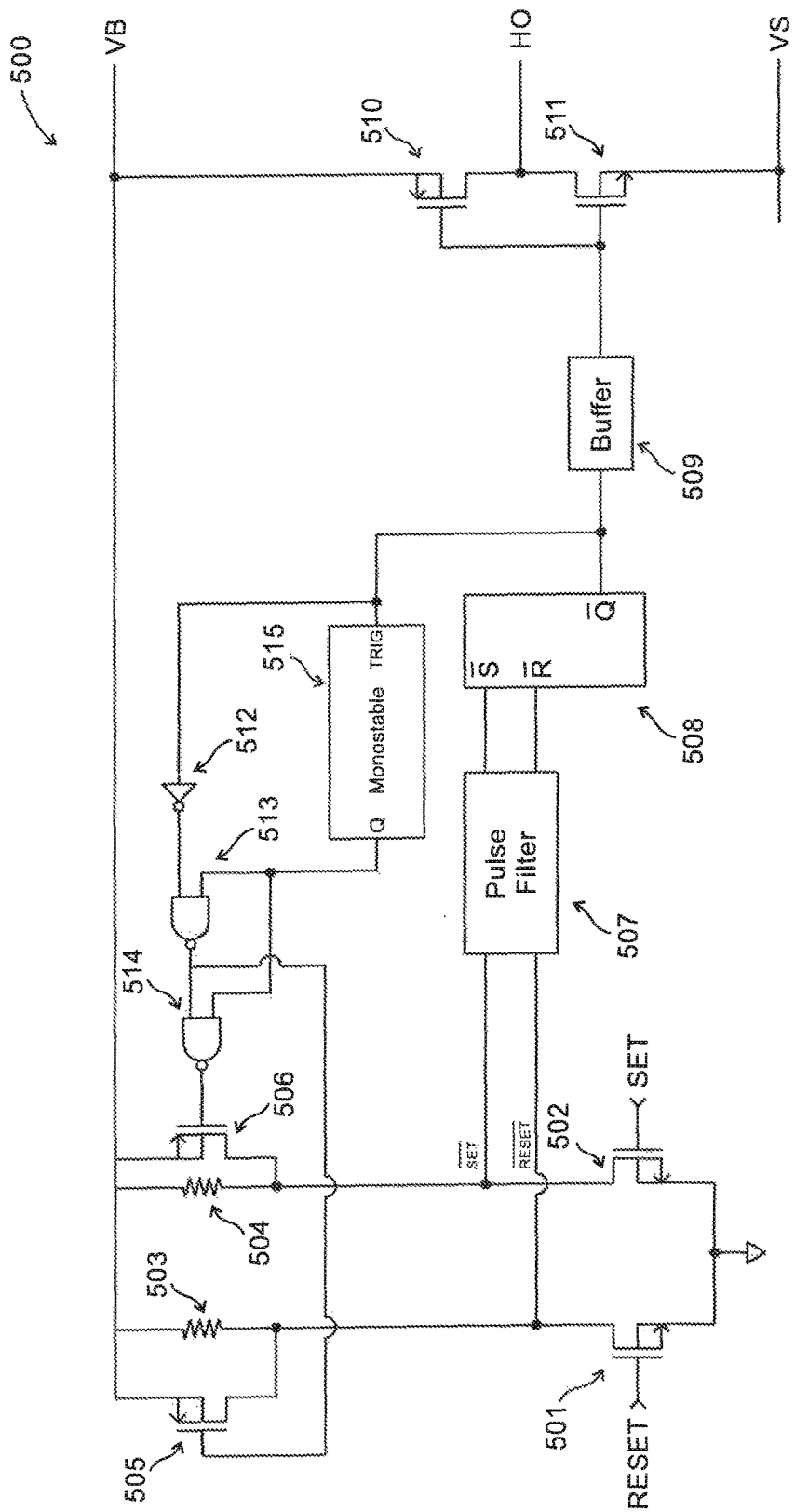
FIG. 5 is a high-side control circuit operable in both set-dominant and reset-dominant configurations in accordance with an embodiment of the invention.

FIG. 5 shows a high-side control circuit 500 in another embodiment of the invention that can address the above issue. The circuit 500 in FIG. 5 is very similar to the circuit 300 in FIG. 3 (like components are represented using reference numerals of FIG. 3 plus 200), except that a mono-stable circuit 515 is added to generate the resistance modulation timing for achieving set-dominant and reset-dominant functions, and NAND gates 513 and 514 are used in place of the inverters 313 and 314. The mono-stable circuit 515 generates a narrow positive pulse output for each edge change at its TRIG input, for both rising and falling edges. With such modifications, resistance modulation in the circuit 500 only occurs during state transition, i.e., when high-side output HO changes from high to low, and vice versa, and optionally also shortly after the state transition.

Various modifications can be made to the circuit 500 in FIG. 5 to provide other embodiments of the invention. These modifications include the above-described modifications that can be made to the circuit 300 in FIG. 3. In addition, the NAND gates 513, 514 may be replaced with other logic components to achieve the same function of providing set-dominant and reset-dominant functions.

The circuit embodiments 300, 500 in FIGS. 3 and 5 are both arranged to implement state dependent set-dominant and reset-dominant level shifting. However, in some applications, it may be preferable to use only state dependent set-dominant level shifting, or only state dependent reset-dominant level shifting.

Figure 6A:
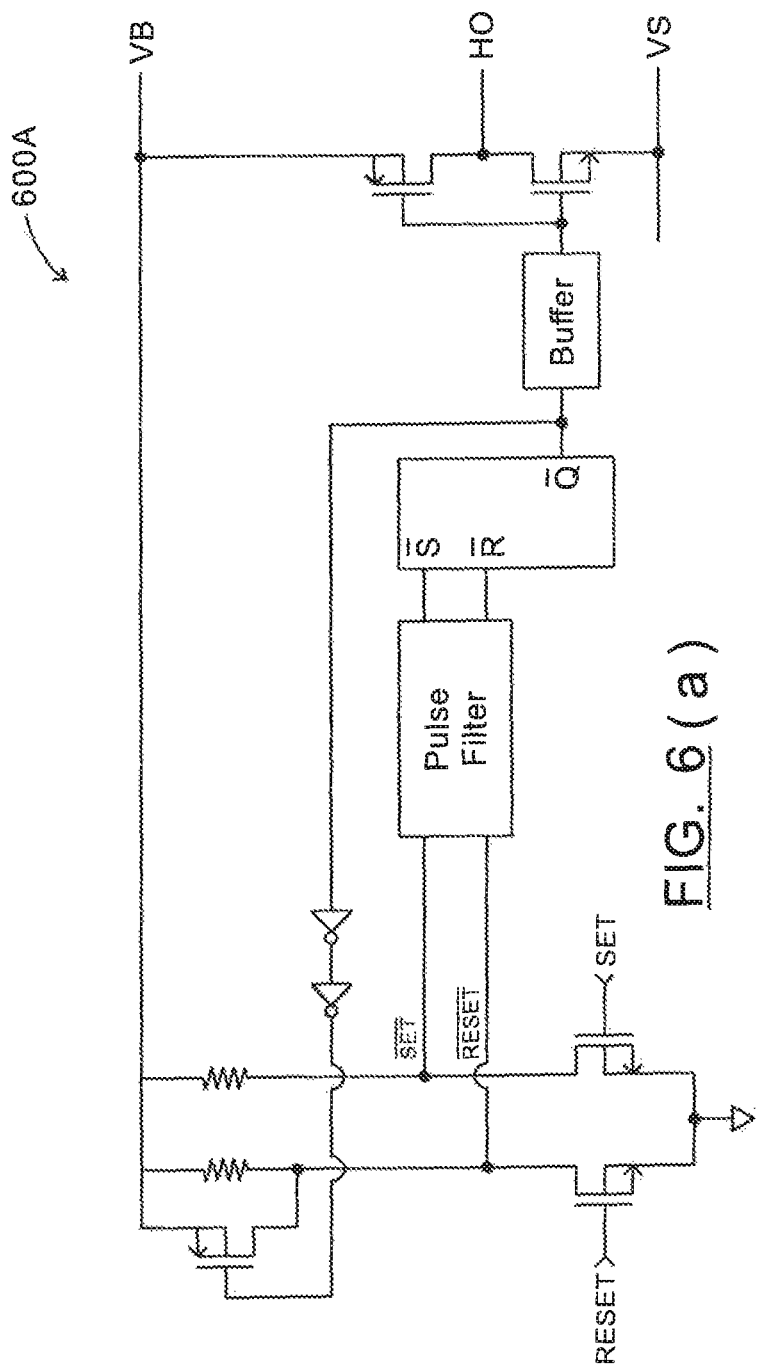
FIG. 6(a) is a high-side control circuit operable in a set-dominant configuration in accordance with an embodiment of the invention.
Figure 6B:
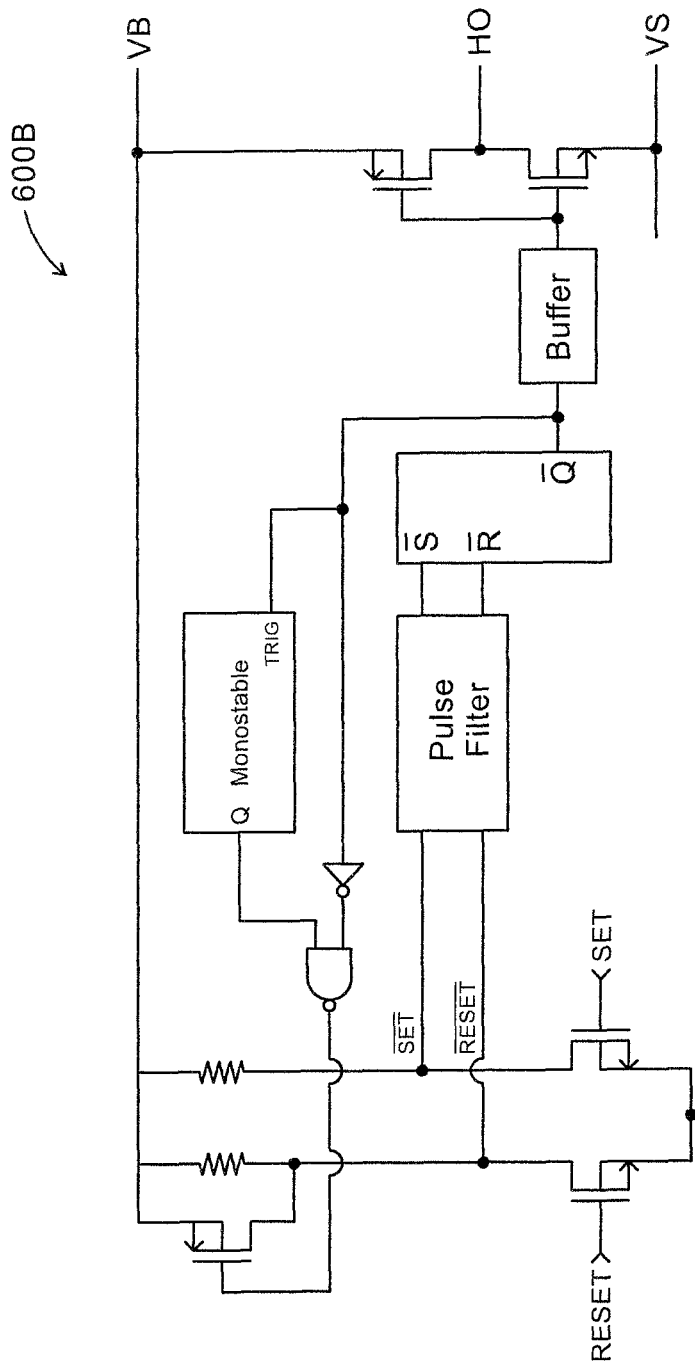
FIG. 6(b) is a high-side control circuit operable in a set-dominant configuration in accordance with an embodiment of the invention.

FIGS. 6(a) and 6(b) show two high-side control circuit embodiments 600A, 600B that are only arranged to perform state dependent set-dominant level shifting. In FIG. 6(a), the circuit 600A is generally the same as that in FIG. 3, except that the inverter 314 and the MOSFET 306 are removed such that only the resistance across the resistor connected to the $\overline{RESET}$ node is modulated. In FIG. 6(b), the circuit 600B is generally the same as that in FIG. 5, except that the NAND gate 514 and the MOSFET 506 are removed such that only the resistance across the resistor connected to the $\overline{RESET}$ node is modulated.

Figure 7A:
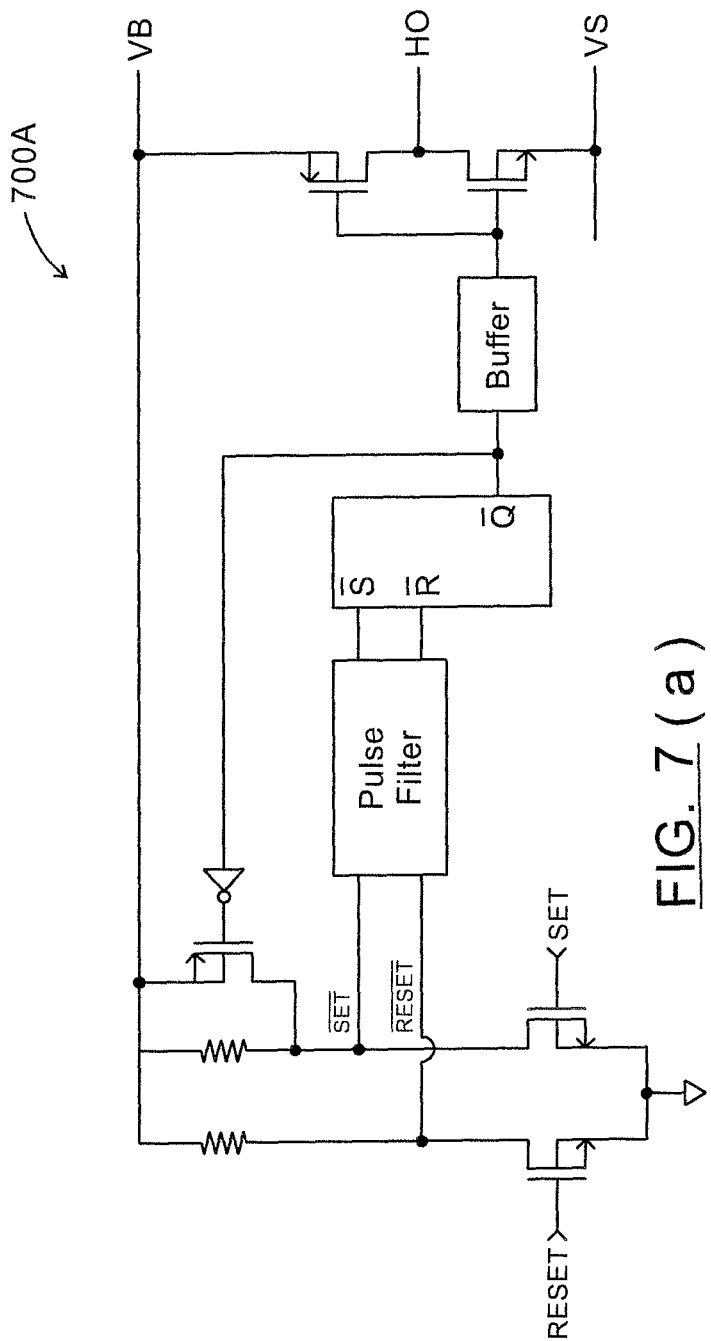
FIG. 7(a) is a high-side control circuit operable in a reset-dominant configuration in accordance with an embodiment of the invention.
Figure 7B:
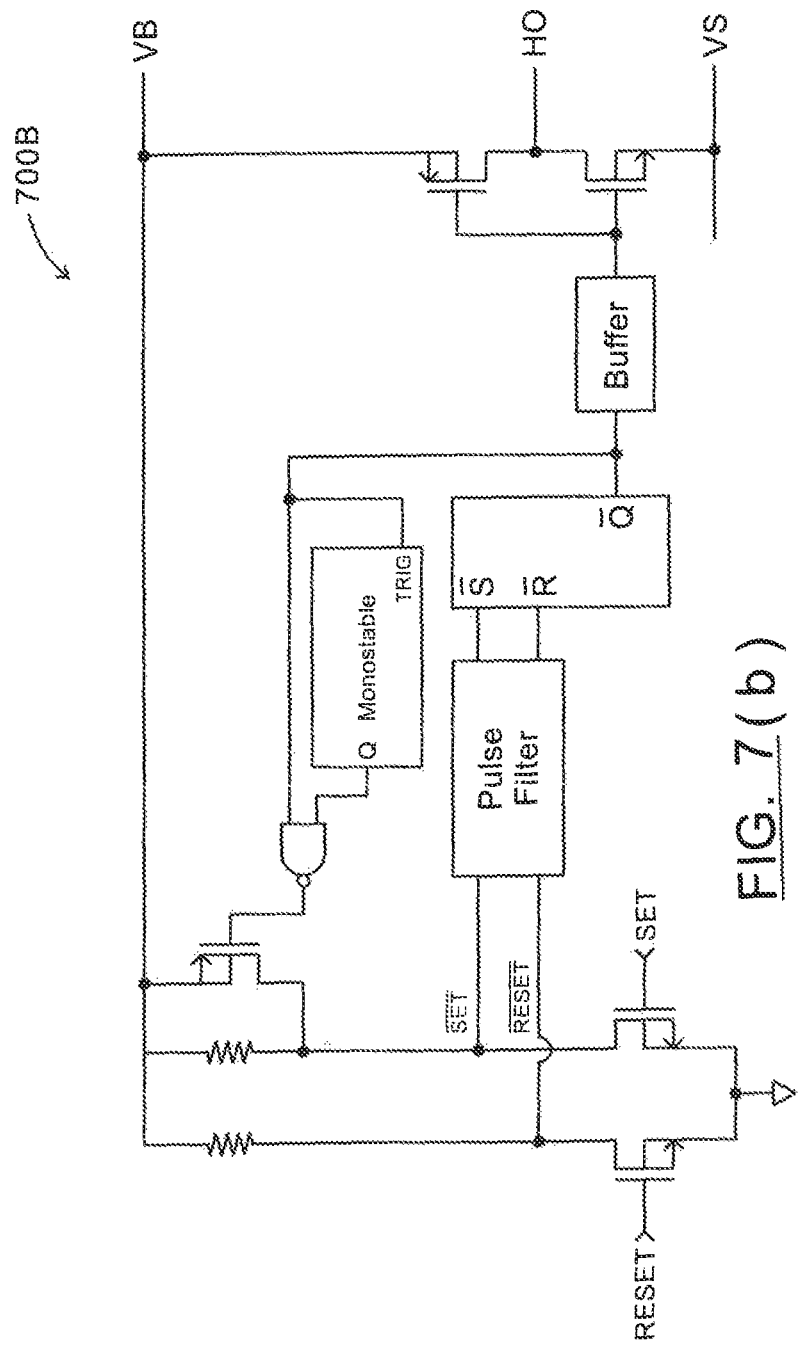
FIG. 7(b) is a high-side control circuit operable in a reset-dominant configuration in accordance with an embodiment of the invention.

FIGS. 7(a) and 7(b) show two high-side control circuit embodiments 700A, 700B that are only arranged to perform state dependent reset-dominant level shifting. In FIG. 7(a), the circuit 700A is generally the same as that in FIG. 3, except that the inverters 312, 313 and the MOSFET 305 are removed such that only the resistance across the resistor connected to the $\overline{SET}$ node is modulated. In FIG. 7(b), the circuit 700B is generally the same as that in FIG. 5, except that the inverter 512, the NAND gate 513, and the MOSFET 505 are removed such that only the resistance across the resistor connected to the $\overline{\text{SET}}$ node is modulated.

Various modifications applicable to the circuits 300, 500 in FIGS. 3 and 5 are also applicable to the circuits 600A, 600B, 700A, 700B in FIGS. 6(a)-7(b).

Whilst the accompanying drawings illustrated specific circuits falling within the scope of the invention, it will be understood that modifications or alternations may be made thereto without departing from the scope of the invention as defined by the appended claims.

The invention claimed is:

1. A circuit for controlling a high-side power switch comprising:
   a level shifting circuit configured to receive an input signal for selectively configuring a logic command circuit to be in a set state, for providing a first output signal to the high-side power switch, and in a reset state, for providing a second output signal, different from the first output signal, to the high-side power switch, wherein the level shifting circuit comprises
      a first switch connected the logic command circuit and arranged to receive the input signal;
      a second switch connected to the logic command circuit and arranged to receive the input signal,
      a first resistor connected between the first switch and a high-side voltage supply, and
      a second resistor connected between the second switch and the high-side voltage supply; and
   a regulation circuit configured to detect an indicative signal, indicative of the output signal provided to the high-side power switch, and to change sensitivity of the level shifting circuit to the input signal based on the indicative signal that is detected, wherein
      the regulation circuit is arranged for changing the sensitivity of the level shifting circuit to the input signal by changing at least one of:
         a first equivalent resistance between the first switch and a high-side voltage supply, and
         a second equivalent resistance between the second switch and the high side power supply terminal;
      the regulation circuit comprises at least one of:
         a third switch connected across the first resistor, and selectively controlled to turn-on and turn-off based on the indicative signal that is detected to change equivalent resistance between the first switch and the high-side voltage supply, and
         a fourth switch connected across the second resistor, and selectively controlled to turn-off and turn-on based on the indicative signal that is detected to change equivalent resistance between the second switch and the high-side voltage supply; and
      the regulation circuit comprises a control logic circuit comprising a mono-stable circuit to turn-on the third switch in a period during which the indicative signal that is detected indicates a transition from the first output signal to the second output signal, and turn-off the third switch otherwise.

2. The circuit in accordance with claim 1, wherein the regulation circuit is configured to arrange the level shifting circuit to be in a set-dominant configuration, in which the sensitivity of the level shifting circuit to the input signal for configuring the logic command circuit to a reset state is reduced, in a period during which the detected indicative signal that is detected indicates a transition from the second output signal to the first output signal.

3. The circuit in accordance with claim 1, wherein the regulation circuit is configured to arrange the level shifting circuit to be in a set-dominant configuration, in which the sensitivity of the level shifting circuit to the input signal for configuring the logic command circuit to a reset state is reduced, when the indicative signal that is detected indicates that the first output signal is provided to the high-side power switch.

4. The circuit in accordance with claim 1, wherein the regulation circuit is configured to arrange the level shifting circuit to be in a reset-dominant configuration, in which the sensitivity of the level shifting circuit to the input signal for configuring the logic command circuit to a set state is reduced, in a period during which the indicative signal that is detected indicates a transition from the first output signal to the second output signal.

5. The circuit in accordance with claim 1, wherein the regulation circuit is configured to arrange the level shifting circuit to be in a reset-dominant configuration, in which the sensitivity of the level shifting circuit to the input signal for configuring the logic command circuit to a set state is reduced, when the indicative signal that is detected indicates that the second output signal is provided to the high-side power switch.

6. The circuit in accordance with claim 1, wherein the regulation circuit is configured to arrange the level shifting circuit to be in:
   a set-dominant configuration, in which the sensitivity of the level shifting circuit to the input signal for configuring the logic command circuit to a reset state is reduced, in a period during which the indicative signal that is detected indicates a transition from the second output signal to the first output signal; and
   a reset-dominant configuration, in which the sensitivity of the level shifting circuit to the input signal for configuring the logic command circuit to a set state is reduced, in a period during which the indicative signal that is detected indicates a transition from the first output signal to the second output signal.

7. The circuit in accordance with claim 1, wherein the regulation circuit is configured to arrange the level shifting circuit to be in:
   a set-dominant configuration, in which the sensitivity of the level shifting circuit to the input signal for configuring the logic command circuit to a reset state is reduced, when the detected signal indicates that the first output signal is provided to the high-side power switch; and
   a reset-dominant configuration, in which the sensitivity of the level shifting circuit to the input signal for configuring the logic command circuit to a set state is reduced, when the indicative signal that is detected indicates that the second output signal is provided to the high-side power switch.

8. A circuit for controlling a high-side power switch comprising:
   a level shifting circuit configured to receive an input signal for selectively configuring a logic command circuit to be in a set state, for providing a first output signal to the high-side power switch, and in a reset state, for providing a second output signal, different from the first output signal, to the high-side power switch, wherein the level shifting circuit comprises
      a first switch connected the logic command circuit and arranged to receive the input signal,
      a second switch connected to the logic command circuit and arranged to receive the input signal, a first resistor connected between the first switch and a high-side voltage supply, and a second resistor connected between the second switch and the high-side voltage supply; and a regulation circuit configured to detect an indicative signal, indicative of the output signal provided to the high-side power switch, and to change sensitivity of the level shifting circuit to the input signal based on the indicative signal that is detected, wherein the regulation circuit is arranged for changing the sensitivity of the level shifting circuit to the input signal by changing at least one of:

a first equivalent resistance between the first switch and a high-side voltage supply, and a second equivalent resistance between the second switch and the high side power supply terminal;

the regulation circuit comprises at least one of:

a third switch connected across the first resistor, and selectively controlled to turn-on and turn-off based on the indicative signal that is detected to change equivalent resistance between the first switch and the high-side voltage supply; and a fourth switch connected across the second resistor, and selectively controlled to turn-off and turn-on based on the indicative signal that is detected to change equivalent resistance between the second switch and the high-side voltage supply; and the regulation circuit comprises a control logic circuit comprising a mono-stable circuit to turn-on the fourth switch in a period during which the detected indicative signal that is detected indicates a transition from the second output signal to the first output signal, and turn-off the fourth switch otherwise.

9. The circuit in accordance with claim 8, wherein the regulation circuit is arranged to control one or both of the first and second equivalent resistances such that:

the first equivalent resistance is lower in resistance than the second equivalent resistance in a period during which the indicative signal that is detected indicates a transition from the first output signal to the second output signal; and the first equivalent resistance is higher in resistance than the second equivalent resistance otherwise.

10. The circuit in accordance with claim 8, wherein the regulation circuit is arranged to control one or both of the first and second equivalent resistances such that:

the first equivalent resistance is lower in resistance than the second equivalent resistance when the indicative signal that is detected indicates that the second output signal is provided to the high-side power switch; and the first equivalent resistance is higher in resistance than the second equivalent resistance otherwise.

11. The circuit in accordance with claim 8, wherein the regulation circuit is arranged to control one or both of the first and second equivalent resistances such that:

the first equivalent resistance is higher in resistance than the second equivalent resistance in a period during which the indicative signal that is detected indicates a transition from the second output signal to the first output signal; and the first equivalent resistance is lower in resistance than the second equivalent resistance otherwise.

12. The circuit in accordance with claim 8, wherein the regulation circuit is arranged to control one or both of the first and second equivalent resistances such that:

the first equivalent resistance is higher in resistance than the second equivalent resistance when the indicative signal that is detected indicates that the first output signal is provided to the high-side power switch; and the first equivalent resistance is lower in resistance than the second equivalent resistance otherwise.

13. The circuit in accordance with claim 8, wherein the first switch and the second switch are semiconductor switches.

14. The circuit in accordance with claim 8, wherein the first switch and the second switch are identical.

15. The circuit in accordance with claim 8, wherein the regulation circuit comprises a control logic circuit to:

turn-on the third switch when the indicative signal that is detected indicates that the second output signal is provided to the high-side power switch, and turn-off the third switch when the indicative signal that is detected indicates that the first output signal is provided to the high-side power switch.

16. The circuit in accordance with claim 8, wherein the regulation circuit comprises a control logic circuit to:

turn-on the fourth switch when the indicative signal that is detected indicates that the first output signal is provided to the high-side power switch, and turn-off the fourth switch when the indicative signal that is detected indicates that the second output signal is provided to the high-side power switch.

17. The circuit in accordance with claim 8, wherein the first resistor and the second resistor have the same resistance.

18. The circuit in accordance with claim 8, wherein the third switch and the fourth switch are semiconductor switches.

19. The circuit in accordance with claim 8, wherein the third switch and the fourth switch are identical.

20. The circuit in accordance with claim 1, wherein the first output signal turns on the high-side power switch and the second output signal turns off the high-side power switch.

21. The circuit in accordance with claim 1, wherein the signal indicative of the output signal provided to the high-side power switch comprises a signal detected downstream of the logic command circuit.

22. A half bridge driver circuit comprising a circuit in accordance with claim 1.

23. An integrated circuit comprising a circuit in accordance with claim 1.

24. The circuit in accordance with claim 8, wherein the regulation circuit is configured to arrange the level shifting circuit to be in a set-dominant configuration, in which the sensitivity of the level shifting circuit to the input signal for configuring the logic command circuit to a reset state is reduced, in a period during which the detected indicative signal that is detected indicates a transition from the second output signal to the first output signal.

25. The circuit in accordance with claim 8, wherein the regulation circuit is configured to arrange the level shifting circuit to be in a set-dominant configuration, in which the sensitivity of the level shifting circuit to the input signal for configuring the logic command circuit to a reset state is reduced, when the indicative signal that is detected indicates that the first output signal is provided to the high-side power switch.

26. The circuit in accordance with claim 8, wherein the regulation circuit is configured to arrange the level shifting circuit to be in a reset-dominant configuration, in which the sensitivity of the level shifting circuit to the input signal for configuring the logic command circuit to a set state is reduced, in a period during which the indicative signal that is detected indicates a transition from the first output signal to the second output signal.

27. The circuit in accordance with claim 8, wherein the regulation circuit is configured to arrange the level shifting circuit to be in a reset-dominant configuration, in which the sensitivity of the level shifting circuit to the input signal for configuring the logic command circuit to a set state is reduced, when the indicative signal that is detected indicates that the second output signal is provided to the high-side power switch.

28. The circuit in accordance with claim 8, wherein the regulation circuit is configured to arrange the level shifting circuit to be in:
- a set-dominant configuration, in which the sensitivity of the level shifting circuit to the input signal for configuring the logic command circuit to a reset state is reduced, in a period during which the indicative signal that is detected indicates a transition from the second output signal to the first output signal; and
- a reset-dominant configuration, in which the sensitivity of the level shifting circuit to the input signal for configuring the logic command circuit to a set state is reduced, in a period during which the indicative signal that is detected indicates a transition from the first output signal to the second output signal.

29. The circuit in accordance with claim 8, wherein the regulation circuit is configured to arrange the level shifting circuit to be in:
- a set-dominant configuration, in which the sensitivity of the level shifting circuit to the input signal for configuring the logic command circuit to a reset state is reduced, when the detected signal indicates that the first output signal is provided to the high-side power switch; and
- a reset-dominant configuration, in which the sensitivity of the level shifting circuit to the input signal for configuring the logic command circuit to a set state is reduced, when the indicative signal that is detected indicates that the second output signal is provided to the high-side power switch.

* * * * *